US009313876B2

(12) United States Patent
Dogauchi

(10) Patent No.: US 9,313,876 B2
(45) Date of Patent: Apr. 12, 2016

(54) MOUNTING STRUCTURE AND MOUNTING METHOD

(71) Applicant: Murata Manufacturing Co., Ltd., Nagaokakyo-shi, Kyoto-fu (JP)

(72) Inventor: Kazuo Dogauchi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 408 days.

(21) Appl. No.: 13/905,446

(22) Filed: May 30, 2013

(65) Prior Publication Data

US 2013/0329388 A1     Dec. 12, 2013

(30) Foreign Application Priority Data

Jun. 12, 2012    (JP) ................................ 2012-133218

(51) Int. Cl.
| | |
|---|---|
| H01G 4/30 | (2006.01) |
| H05K 1/02 | (2006.01) |
| H05K 3/30 | (2006.01) |
| H05K 1/18 | (2006.01) |
| H05K 3/34 | (2006.01) |

(52) U.S. Cl.
CPC .............. *H05K 1/0216* (2013.01); *H05K 1/181* (2013.01); *H05K 3/30* (2013.01); *H05K 3/3442* (2013.01); *H05K 2201/10515* (2013.01); *H05K 2201/2045* (2013.01); *Y02P 70/611* (2015.11); *Y02P 70/613* (2015.11); *Y10T 29/4913* (2015.01)

(58) Field of Classification Search
USPC .................... 361/321.2, 311, 301.4, 328–329
See application file for complete search history.

(56) References Cited

U.S. PATENT DOCUMENTS

| 6,181,544 B1 * | 1/2001 | Nakagawa .............. H01G 4/228 361/306.1 |
| 2001/0001258 A1 | 5/2001 | Ishigaki et al. |
| 2010/0220426 A1 * | 9/2010 | Shimizu ................... H01G 4/30 361/306.3 |

FOREIGN PATENT DOCUMENTS

| JP | 11-74147 A | 3/1999 |
| JP | 2000-235931 A | 8/2000 |

(Continued)

OTHER PUBLICATIONS

Official Communication issued in corresponding Japanese Patent Application No. 2012-133218, mailed on Apr. 30, 2014.

(Continued)

*Primary Examiner* — Eric Thomas
(74) *Attorney, Agent, or Firm* — Keating & Bennett, LLP

(57) ABSTRACT

A mounting structure includes a first ceramic electronic component including a ceramic body including internal electrodes and outer electrodes. When a voltage is applied to the outer electrodes, the ceramic body is strained with a first strain amount, and a second ceramic electronic component including a ceramic body including internal electrodes and outer electrodes. When a voltage is applied to the outer electrodes, the ceramic body is strained with a second strain amount greater than the first strain amount. The second ceramic electronic component is arranged above the first ceramic electronic component, and the first and second ceramic electronic components are connected to each other via each other's outer electrodes. The first ceramic electronic component to which the second ceramic electronic component is connected is connected to a land on a circuit substrate via the outer electrodes of at least the first ceramic electronic component.

20 Claims, 5 Drawing Sheets

(56) References Cited

FOREIGN PATENT DOCUMENTS

| JP | 2001-185449 A | | 7/2001 |
|----|---------------|---|--------|
| JP | 2006-199563 A | | 8/2006 |
| JP | 2008021850 a | * | 1/2008 |
| JP | 2012-043947 A | | 3/2012 |

OTHER PUBLICATIONS

Official Communication issued in corresponding Korean Patent Application No. 10-2013-0067127, mailed on Aug. 20, 2014.

* cited by examiner

MOUNTING STRUCTURE AND MOUNTING METHOD

BACKGROUND OF THE INVENTION

1. Field of the Invention

The present invention relates to a mounting structure and a mounting method, and in particular, to a mounting structure and a mounting method used to mount a ceramic electronic component on a circuit substrate.

2. Description of the Related Art

In the past, in a laminated capacitor including a dielectric layer and a capacitor electrode laminated thereto, when a voltage including a ripple component is applied, an electric-field-induced strain occurs in a capacitance portion, and a laminated body expands and contracts. An applied voltage per one sheet of dielectric has been increased with the progress of the miniaturization and/or the thinning of a laminated capacitor, and it has become difficult to ignore the electric-field-induced strain. When stretching vibration occurs in a laminated capacitor mounted (solder-mounted) in a circuit substrate, the stretching vibration is transmitted to the circuit substrate, and the circuit substrate vibrates. In addition, when falling within 20 Hz to 20 kHz, i.e., in an audible range, the frequency of vibration thereof becomes recognized as "acoustic noise" by the human ear.

In the past, various proposals have been made so as to avoid or reduce such "acoustic noise". For example, Japanese Unexamined Patent Application Publication No. 2006-199563 suggests suppressing the "acoustic noise" using, in a laminated ceramic electronic component, a dielectric ceramic material where a strain occurring at the time of the application of a voltage is small. However, in a high-dielectric-constant dielectric ceramic whose main component is barium titanate or the like, commonly used in a laminated ceramic electronic component having high capacitance, the electric-field-induced strain naturally occurs, and it may be difficult to suppress the "acoustic noise".

SUMMARY OF THE INVENTION

Preferred embodiments of the present invention provide a mounting structure and a mounting method which are capable of preventing or significantly reducing acoustic noise produced by a circuit substrate mounted by stacking a plurality of ceramic electronic components.

According to a preferred embodiment of the present invention, a mounting structure includes a first ceramic electronic component including a first ceramic body including a first internal electrode and a first outer electrode, wherein when a voltage is applied to the first outer electrode, the first ceramic body is strained with a first strain amount, and a second ceramic electronic component including a second ceramic body including a second internal electrode and a second outer electrode, wherein when a voltage is applied to the second outer electrode, the second ceramic body is strained with a second strain amount greater than the first strain amount, wherein the second ceramic electronic component is arranged above the first ceramic electronic component, and the first and second ceramic electronic components are connected to each other via the first and second outer electrodes, and the first ceramic electronic component to which the second ceramic electronic component is connected is connected to a land on a circuit substrate via at least the first outer electrode of the first ceramic electronic component.

According to another preferred embodiment of the present invention, a mounting method is used to connect a first ceramic electronic component including a first ceramic body including a first internal electrode and a first outer electrode, wherein when a voltage is applied to the first outer electrode, the first ceramic body is strained with a first strain amount, and a second ceramic electronic component including a second ceramic body including a second internal electrode and a second outer electrode, wherein when a voltage is applied to the second outer electrode, the second ceramic body is strained with a second strain amount greater than the first strain amount to a land on a circuit substrate, the mounting method including arranging the second ceramic electronic component above the first ceramic electronic component, connecting the first and second ceramic electronic components to each other via the first and second outer electrodes, and connecting at least the first outer electrode of the first ceramic electronic component to the land on the circuit substrate.

In the above-described mounting structure and the above-described mounting method, the first ceramic electronic component whose strain amount is relatively small is connected to the land on the circuit substrate, and the second ceramic electronic component whose strain amount is relatively large is connected above the first ceramic electronic component. When a voltage is applied to each of the ceramic electronic components, the second ceramic electronic component is relatively greatly strained, and the first ceramic electronic component is relatively slightly strained. While a strain has a maximum value in the central portion of each of the electronic components in the height direction, the large strain of the second ceramic electronic component is absorbed by the small strain of the first ceramic electronic component, vibration does not significantly occur in a direct joint point between the outer electrode of the first ceramic electronic component and the land in the circuit substrate, and the vibration and resulting acoustic noise of the circuit substrate is significantly reduced or prevented.

According to various preferred embodiments of the present invention, acoustic noise generated by a mounted circuit substrate are significantly reduced or prevented by stacking a plurality of ceramic electronic components.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4A is a graph of a mounting structure in which two electronic components are stacked and mounted, and FIGS. 4B and 4C are graphs of mounting structures in each of which a single electronic component is mounted independently.

DETAILED DESCRIPTION OF THE PREFERRED EMBODIMENTS

Hereinafter, the preferred embodiments of a laminated capacitor according to the present invention will be described with reference to accompanying drawings.

Figure 1:
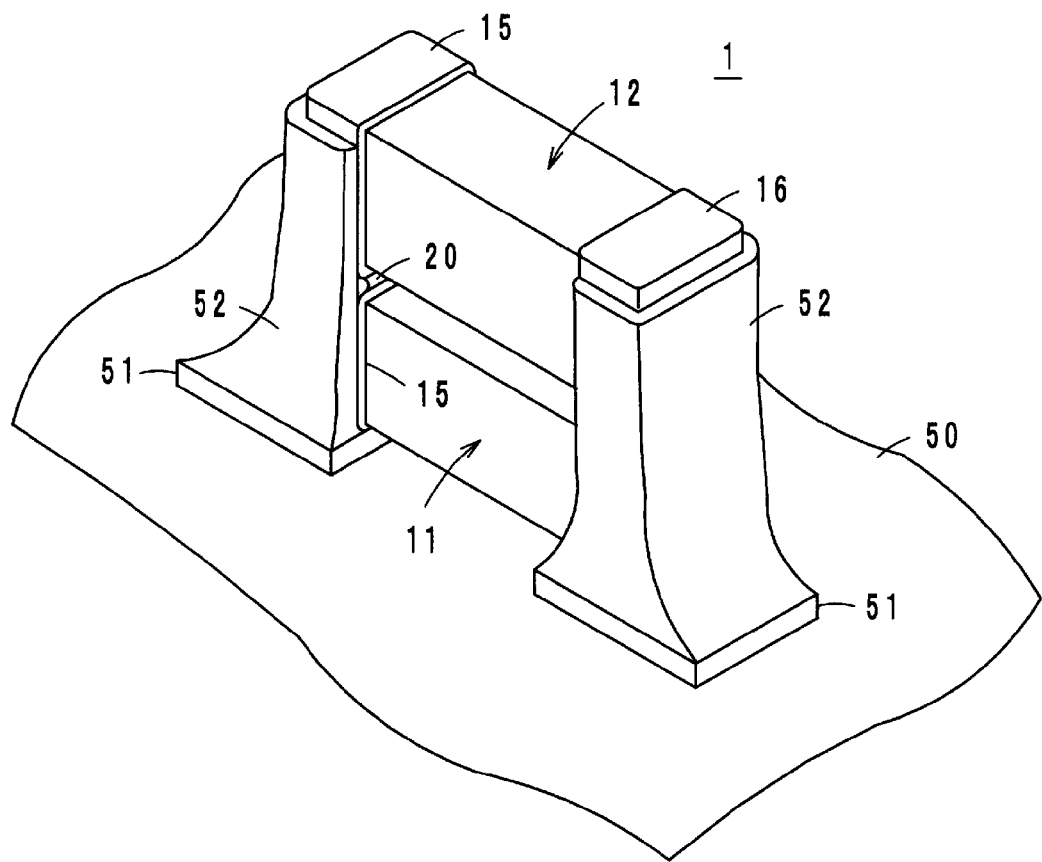
FIG. 1 is a perspective view illustrating a mounting structure according to a preferred embodiment of the present invention.
Figure 2:
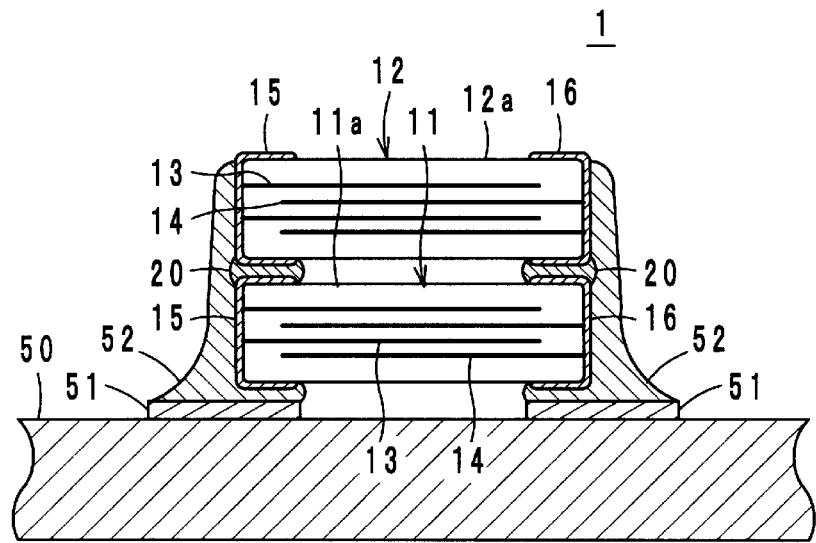
FIG. 2 is a cross-sectional view illustrating the mounting structure according to a preferred embodiment of the present invention.

As illustrated in FIG. 1 and FIG. 2, a mounting structure 1 according to a preferred embodiment of the present invention includes a second ceramic electronic component (second ceramic capacitor 12) arranged on or immediately above a first ceramic electronic component (first ceramic capacitor 11), the outer electrodes 15 and the outer electrodes 16 thereof are connected to each other by solder 20, and furthermore, the outer electrodes 15 and 16 are connected to lands 51 provided in the surface of a substrate 50 by solder 52.

In this mounting structure 1, the solder 52 wets so as to spread over the outer electrodes 15 and 16 of the ceramic capacitor 12 in both of a lower stage and an upper stage. In addition, when a joint strength between the ceramic capacitors 11 and 12 due to the solder 20 is sufficient, connection to the lands 51 by the solder 52 may be a connection to only the outer electrodes 15 and 16 of the ceramic capacitor 11 in the lower stage.

The ceramic capacitors 11 and 12 individually include ceramic bodies (laminated bodies) 11a and 12a in which dielectric layers are laminated, and in each of the ceramic capacitors 11 and 12, a predetermined capacitance portion is defined by internal electrodes 13 and 14 that face each other across a dielectric layer. The outer electrodes 15 and 16 are provided in both end portions of each of the bodies 11a and 12a, the outer electrode 15 is connected to one end of each internal electrode 13, and the outer electrode 16 is connected to one end of each internal electrode 14.

As the dielectric layer, a dielectric ceramic including, for example, a main component of $BaTiO_3$, $CaTiO_3$, $SrTiO_3$, $CaZrO_3$, or other suitable ceramic material may preferably be used. A dielectric ceramic may also be used in which an accessory component, such as a Mn compound, an Mg compound, a Si compound, a Co compound, a Ni compound, or a rare earth compound, for example, is added to the main components. As the internal electrodes 13 and 14, for example, Ni, Cu, Ag, Pd, Ag—Pd alloy, Au, or other suitable material may preferably be used.

The outer electrodes 15 and 16 are defined by thick films or thin films, and it is preferable that the outer electrodes 15 and 16 include a base layer and a plated layer provided thereon. As the base layer, for example, Cu, Ni, Ag, Pd, Ag—Pd alloy, Au, or other suitable material may preferably be used, the base layer may also be a layer that is fired simultaneously with the internal electrodes 13 and 14, and the base layer may also be a layer into which an applied conductive paste is burned. Furthermore, the base layer may also be directly formed in the surfaces of the bodies 11a and 12a by plating, and may also be formed by curing a conductive resin including a thermosetting resin, for example. As the plated layer, for example, Cu, Ni, Ag, Pd, Ag—Pd alloy, Au, or other suitable material may preferably be used, and the plated layer may also including a plurality of plated layers. It is preferable that the plated layer has a double-layer structure including Ni plating and Sn plating, for example.

In the first ceramic capacitor 11, when a voltage is applied to the outer electrodes 15 and 16, the body 11a is strained (expands and contracts) with a first strain amount. In addition, in the second ceramic capacitor 12, when a voltage is applied to the outer electrodes 15 and 16, the body 12a is strained (expands and contracts) with a second strain amount that is greater than the first strain amount.

The strain amounts of the bodies 11a and 12a are adjustable primarily by selecting the material of the dielectric. If a material whose dielectric constant is low or a material whose electric field strength is low is used, a strain amount will be relatively small. For example, the body 11a in the first ceramic capacitor 11 disposed in the lower stage is preferably made of a low-dielectric-constant ceramics material, and the body 12a in the second ceramic capacitor 12 disposed in the upper stage is preferably made of a high-dielectric-constant ceramics material. Alternatively, an electric field strength applied to the body 11a in the first ceramic capacitor 11 disposed in the lower stage is decreased, and an electric field strength applied to the body 12a in the second ceramic capacitor 12 disposed in the upper stage is increased.

In addition, even if the same or substantially the same material is used as the dielectric material, the strain amounts of the bodies 11a and 12a are adjustable due to electrostatic capacities. When the dielectric layers include the same or substantially the same material and the number of the internal electrodes 13 and 14 is reduced, the strain amounts are relatively small. For example, the number of the internal electrodes 13 and 14 in the first ceramic capacitor 11 disposed in the lower stage is set to be less than the number of the internal electrodes 13 and 14 in the second ceramic capacitor 12 disposed in the upper stage.

Figure 3:
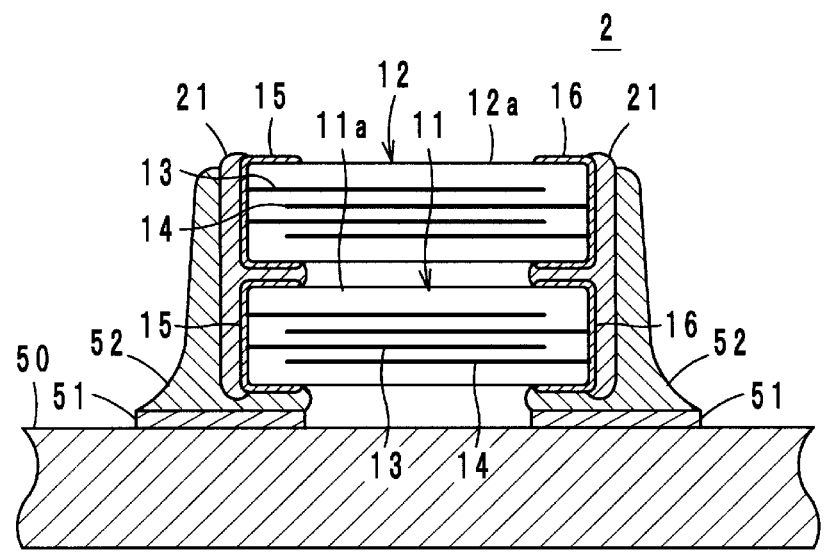
FIG. 3 is a cross-sectional view illustrating an example of a modification to the mounting structure according to a preferred embodiment of the present invention.

FIG. 3 illustrates a mounting structure 2 as an example of a modification to the mounting structure 1, and in the mounting structure 2, the outer electrodes 15 and the outer electrodes 16 of the ceramic capacitors 11 and 12 are integrally connected by terminal members 21 and are connected to the land 51 in the circuit substrate 50 through the solder 52 via the terminal members 21. The other configurations are preferably the same or substantially the same as the mounting structure 1.

Figure 4A:
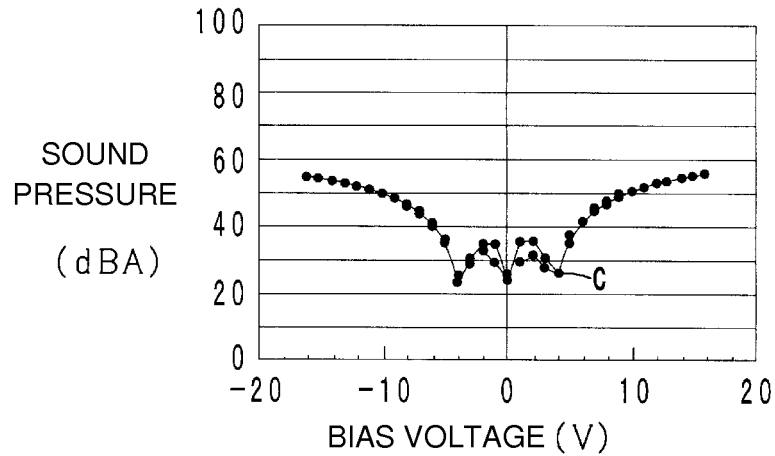
FIGS. 4A to 4C are graphs illustrating sound pressure characteristics in mounting structures.
Figure 4B:
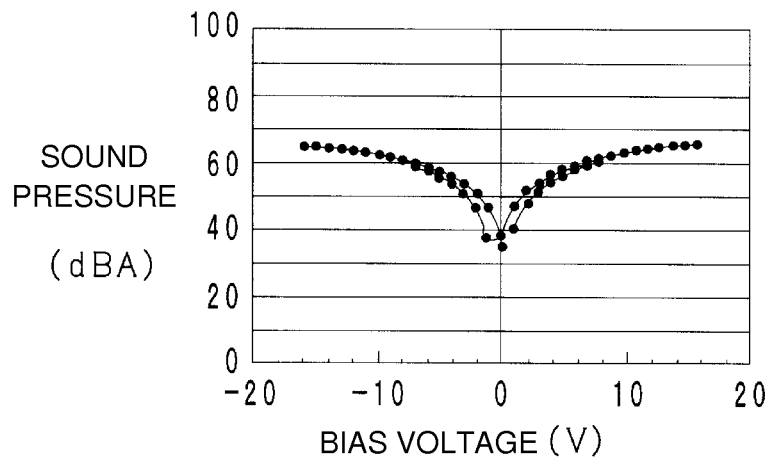
Figure 4C:
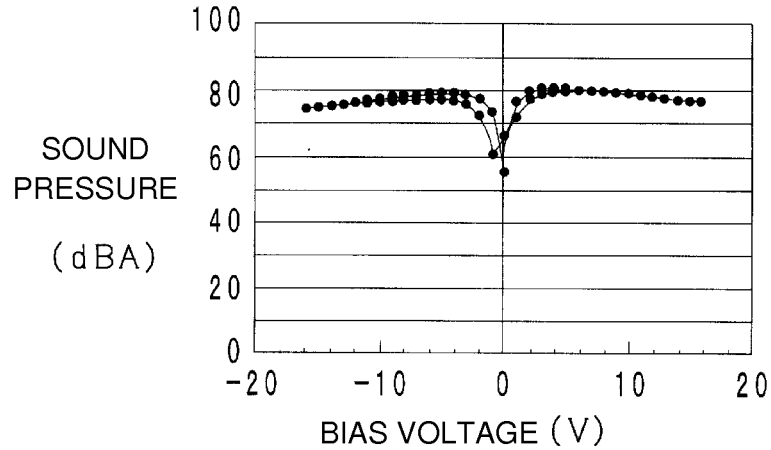

In the above-mentioned mounting structure 1, the results of sound pressure measurements performed by the inventor of the present invention are illustrated in FIGS. 4A to 4C. Each of the ceramic capacitors 11 and 12 preferably is about 2.0 mm long, about 1.25 mm wide, and about 1.25 mm high, the capacitance of the ceramic capacitor 11 in the lower stage is about 1 µf, and the capacitance of the ceramic capacitor 12 in the upper stage is about 22 µf, for example. As the circuit substrate 50, a circuit substrate preferably is used that has a size of about 100 mm×about 40 mm and is about 1.6 mm thick, for example. The capacitors 11 and 12 of the mounting structure 1 are connected to the central portion of the circuit substrate 50.

At a resonant frequency of about 1 Vpp, located near about 3 kHz, a direct-current bias voltage was changed from about 0 V, to about 16 V, to about −16 V, and to about 0 V, and a sound pressure level was measured using a microphone set immediately above the mounting structure 1.

FIG. 4A illustrates a sound pressure level of the mounting structure 1. FIG. 4B illustrates a sound pressure level when the ceramic capacitor 11 in the lower stage was independently mounted on the circuit substrate 50. FIG. 4C illustrates a sound pressure level when the ceramic capacitor 12 in the upper stage was independently mounted on the circuit substrate 50. It is clear that, compared to FIGS. 4B and 4C, the sound pressure level of the mounting structure 1, illustrated in FIG. 4A, is reduced by about 20 dB, for example. In addition, the range of a bias voltage at which the sound pressure is significantly reduced or prevented is expanded.

Next, a mechanism for reducing a sound pressure level caused by an electric-field-induced strain will be described with reference to FIGS. 5A and 5B and FIGS. 6A and 6B.

Figure 5A:
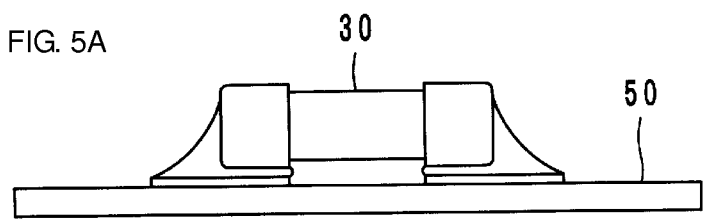
FIGS. 5A and 5B are diagrams illustrating electric-field-induced strains when a ceramic electronic component is independently mounted on a circuit substrate.
Figure 5B:
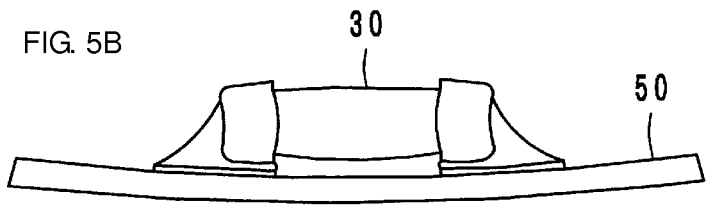

First, FIG. 5A schematically illustrates a structure in which a ceramic electronic component 30 is independently solder-mounted on the circuit substrate 50. When a voltage is applied to the ceramic electronic component 30, a ceramic body expands in a thickness direction as illustrated in FIG. 5B, and contracts in a longitudinal direction due to the Poisson's effect. Accordingly, the circuit substrate 50 bends. Due to the application of an alternating-current voltage, the contraction and restoration of the body in the longitudinal direction lead to the vibration of the circuit substrate 50, and acoustic noise is produced.

Here, when a strain is denoted as S, a stress is denoted as T, and an electric field is denoted as E, the following expression is satisfied.

$$S = s^E T + dE \quad (1)$$

The $s^E$ is an elastic compliance coefficient, and the d is a piezoelectric constant.

Figure 6A:
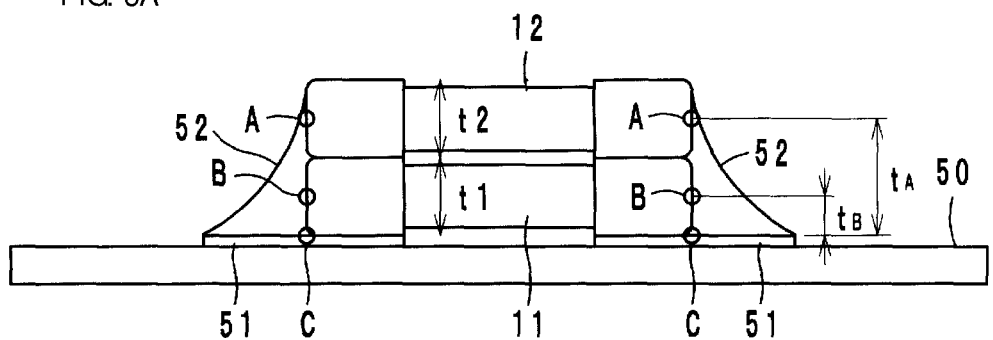
FIGS. 6A and 6B are diagrams schematically illustrating a mechanism of vibration prevention due to the mounting structure.

Next, a relationship between the strains of the capacitors 11 and 12 and the strain of the circuit substrate 50 when mounted in the above-described mounting structure 1 will be considered. When it is assumed that the above-mentioned mounting structure 1 has a simple link mechanism, the mounting structure 1 can be simplified as illustrated in FIG. 6A. Strains in the central portions A and B (portions whose displacement amounts are the largest) of the capacitors 12 and 11 in a height direction and a joint portion C with the circuit substrate 50 are denoted as $S_A$, $S_B$, and $S_C$, respectively. In addition, heights from the point C to the points A and B are denoted as $t_A$ and $t_B$, respectively.

When the heights of the capacitors 11 and 12 are denoted as t1 and t2, the $t_A$ and $t_B$ are expressed by the following Expressions.

$$t_A = 1/2 t2 + t1 \quad (2)$$

$$t_B = 1/2 t1 \quad (3)$$

Figure 6B:
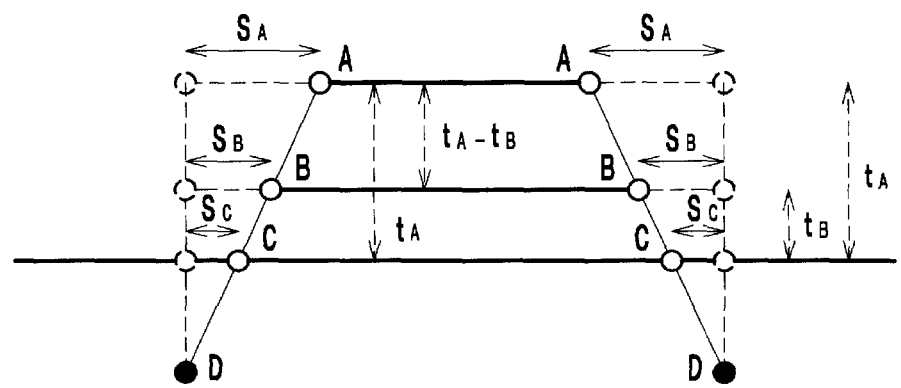

When being schematically illustrated, a relationship between a strain and a height is illustrated in FIG. 6B. At this time, the following correlation is satisfied between a strain and a height.

$$(S_A - S_C):(S_B - S_C) = t_A:(t_A - t_B) = (1/2t2 + t1):(1/2t2 + 1/2t1) \quad (4)$$

Accordingly, the relationship between a strain and a height is expressed by the following Expression.

$$(S_A - S_C)/(S_A - S_B) = (1/2t2 + t1)/(1/2t2 + 1/2t1) \quad (5)$$

In accordance with Expression (5), from the strains $S_B$ and $S_A$ and the heights t1 and t2 of the capacitors and 12, the strain $S_C$ of the circuit substrate 50 is obtained. In addition, in the correlation of a strain, a point D at which a strain is about "0", that is, a virtual fixed point, exists (refer to FIG. 6B). When this fixed point D coincides with the point C ($S_C$=about 0), the transmission of the strains of the capacitors 11 and 12 is attenuated such that the strain of the circuit substrate 50 is close to about "0". The design condition of the capacitors 11 and 12 in the above-described mounting structure 1 is expressed by the following relational expression.

$$S_B/S_A = 1 - (t2 + t1)/(t2 + 2t1) \quad (6)$$

In other words, in the case of an elastic compliance coefficient and a piezoelectric constant satisfying Expression (6), the strain of the circuit substrate 50 does not occur. When the ceramic capacitors 11 and 12 in the lower stage and the upper stage expand and contract such that the fixed point D is located at the point C, the transmission of the strains of the capacitors 11 and 12 is attenuated, the strain of the point C is small, and a sound pressure is significantly reduced or prevented.

The transmission of the strains of the capacitors and 12 is effectively attenuated by a clearance gap between the capacitor 11 and the capacitor 12 and a clearance gap between the capacitor 11 and the circuit substrate 50. In other words, by adjusting the height of the clearance gap, it may be possible to further reduce or prevent a sound pressure.

From a practical standpoint, the solder 52 is not a rigid body, and the bodies 11a and 12a are similar to rigid bodies. In addition, influenced by the polarization of a dielectric, the piezoelectric constant also does not have a rectilinear characteristic. However, in the vicinity of the satisfaction of the condition of Expression (6), a sound pressure is significantly reduced or prevented.

For the reasons described above, in the mounting structure 1, a sound pressure is significantly reduced and it is possible to significantly reduce or prevent acoustic noise from being generated, as compared to a case in which the capacitors 11 and 12 are independently mounted.

When, in the lower stage in the mounting structure 1, a ceramic electronic component is used in which an electric-field-induced strain does not substantially occur, if the relationship of the Expression (6) is deviated from, a sound pressure reducing or preventing effect is degraded. According to the present preferred embodiment, it is possible to effectively reduce or prevent generation of acoustic noise, such that if the electric-field-induced strain of the ceramic electronic component in the lower stage is set to a predetermined value so that the fixed point D is located in the circuit substrate 50, it is possible to significantly reduce a sound pressure close to about zero.

In addition, the present invention is not limited to the above-mentioned preferred embodiment and modification, and various modifications may be made.

In particular, the particular shape of a laminated body or a capacitor electrode is arbitrary, the number of disposed capacitor electrodes is arbitrary, and the disposition directions thereof with respect to a mounting surface are arbitrary. While a capacitance value of a capacitor is also arbitrary, it has been known that a capacitor whose capacitance value is greater than or equal to about 1 μF usually produces acoustic noise. In addition, preferred embodiments of the present invention may also be applied to a ceramic electronic component, such as a piezoelectric component or a coil component other than a capacitor.

As described above, preferred embodiments of the present invention are useful in a mounting structure and a mounting method for a ceramic electronic component and, in particular, are superior in terms of significantly reducing or preventing generation of acoustic noise by a circuit substrate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A mounting structure comprising:
   a first ceramic electronic component including a first ceramic body including a first internal electrode and a first outer electrode, wherein when a voltage is applied to the first outer electrode, the first ceramic body is strained with a first strain amount; and a second ceramic electronic component including a second ceramic body including a second internal electrode and a second outer electrode, wherein when a voltage is applied to the second outer electrode, the second ceramic body is strained with a second strain amount greater than the first strain amount; wherein the second ceramic electronic component is arranged above the first ceramic electronic component, and the first and second ceramic electronic components are connected to each other via the first and second outer electrodes;

the first ceramic electronic component to which the second ceramic electronic component is connected is connected to a land on a circuit substrate via at least the first outer electrode of the first ceramic electronic component;

where $t_B$ denotes a first height of a first central portion of the first ceramic body measured from the circuit substrate, SB denotes the first strain amount of the first central portion, $t_A$ denotes a second height of a second central portion of the second ceramic body measured from the circuit substrate, and SA denotes the second strain amount of the second central portion, a distance $t_D$ from the second central portion of the second ceramic body to a fixed point on the circuit substrate measured in a direction toward the circuit substrate is equal to $SA(t_A - t_B)/(SA-SB)$.

2. The mounting structure according to claim 1, wherein in addition to the first outer electrode of the first ceramic electronic component, the second outer electrode of the second ceramic electronic component is also connected to the land on the circuit substrate.

3. The mounting structure according to claim 1, further comprising:

a terminal member arranged integrally connect the first outer electrode of the first ceramic electronic component and the second outer electrode of the second ceramic electronic component; wherein the first ceramic electronic component to which the second ceramic electronic component is connected is connected to the land via the terminal member.

4. The mounting structure according to claim 1, wherein at least one of the first ceramic electronic component and the second ceramic electronic component is a laminated capacitor.

5. The mounting structure according to claim 1, wherein the first and second outer electrodes are connected to one another via solder.

6. The mounting structure according to claim 1, wherein the first outer electrode is connected to the land on the circuit board via solder.

7. The mounting structure according to claim 1, wherein
the first ceramic electronic component includes two of the first outer electrodes disposed on opposed ends of the first ceramic body;
the second ceramic electronic component includes two of the second outer electrodes disposed on opposed ends of the second ceramic body; and
respective pairs of the first and second outer electrodes are connected to one another.

8. The mounting structure according to claim 1, wherein each of the first and second ceramic bodies include at least one of $BaTiO_3$, $CaTiO_3$, $SrTiO_3$, $CaZrO_3$ as a main component.

9. The mounting structure according to claim 8, wherein each of the first and second ceramic bodies further includes at least one of a Mn compound, an Mg compound, a Si compound, a Co compound, a Ni compound, or a rare earth compound as an accessory component.

10. The mounting structure according to claim 1, wherein each of the first and second outer electrodes includes a thick film base layer and a plated layer provided on the thick film base layer.

11. A mounting method for connecting a first ceramic electronic component including a first ceramic body including a first internal electrode and a first outer electrode, wherein when a voltage is applied to the first outer electrode, the first ceramic body is strained with a first strain amount, and a second ceramic electronic component including a second ceramic body including a second internal electrode and a second outer electrode, wherein when a voltage is applied to the second outer electrode, the second ceramic body is strained with a second strain amount greater than the first strain amount, to a land on a circuit substrate, the mounting method comprising:

arranging the second ceramic electronic component above the first ceramic electronic component;

connecting the first and second ceramic electronic components to each other via the first and second outer electrodes; and connecting at least the first outer electrode of the first ceramic electronic component to the land on the circuit substrate;

where $t_B$ denotes a first height of a first central portion of the first ceramic body measured from the circuit substrate, SB denotes the first strain amount of the first central portion, $t_A$ denotes a second height of a second central portion of the second ceramic body measured from the circuit substrate, and SA denotes the second strain amount of the second central portion, a distance $t_D$ from the second central portion of the second ceramic body to a fixed point on the circuit substrate measured in a direction toward the circuit substrate is equal to $SA(t_A - t_B)/(SA-SB)$.

12. The mounting method according to claim 11, further comprising:

connecting the second outer electrode of the second ceramic electronic component to the land on the circuit substrate, in addition to the first outer electrode of the first ceramic electronic component.

13. The mounting method according to claim 11, further comprising:

integrally connecting the first outer electrode of the first ceramic electronic component and the second outer electrode of the second ceramic electronic component via a terminal member; wherein the first ceramic electronic component to which the second ceramic electronic component is connected is connected to the land via the terminal member.

14. The mounting method according to claim 11, wherein at least one of the first ceramic electronic component and the second ceramic electronic component is a laminated capacitor.

15. The mounting method according to claim 11, wherein the first and second outer electrodes are connected to one another via solder.

16. The mounting method according to claim 11, wherein the first outer electrode is connected to the land on the circuit board via solder.

17. The mounting method according to claim 11, wherein
the first ceramic electronic component includes two of the first outer electrodes disposed on opposed ends of the first ceramic body;

the second ceramic electronic component includes two of the second outer electrodes disposed on opposed ends of the second ceramic body; and respective pairs of the first and second outer electrodes are connected to one another.

18. The mounting method according to claim 11, wherein each of the first and second ceramic bodies include at least one of $BaTiO_3$, $CaTiO_3$, $SrTiO_3$, $CaZrO_3$ as a main component.

19. The mounting method according to claim 18, wherein each of the first and second ceramic bodies further includes at least one of a Mn compound, an Mg compound, a Si compound, a Co compound, a Ni compound, or a rare earth compound as an accessory component.

20. The mounting method according to claim 11, wherein each of the first and second outer electrodes includes a thick film base layer and a plated layer provided on the thick film base layer.

* * * * *